(12) United States Patent
Akatsuka et al.

(10) Patent No.: US 9,286,924 B1
(45) Date of Patent: Mar. 15, 2016

(54) FLEXIBLE PRINTED CIRCUIT ASSEMBLY AND DISK DRIVE INCLUDING THE SAME

(71) Applicant: KABUSHIKI KAISHA TOSHIBA, Tokyo (JP)

(72) Inventors: Naoto Akatsuka, Yokohama Kanagawa (JP); Hideki Yamaguchi, Sagamihara Kanagawa (JP); Yoshinori Sato, Yokohama Kanagawa (JP); Tomoki Yaguchi, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/744,313

(22) Filed: Jun. 19, 2015

Related U.S. Application Data

(60) Provisional application No. 62/087,030, filed on Dec. 3, 2014.

(51) Int. Cl.
*G11B 21/16* (2006.01)
*G11B 5/48* (2006.01)
*H05K 1/02* (2006.01)

(52) U.S. Cl.
CPC .............. *G11B 5/486* (2013.01); *H05K 1/0281* (2013.01); *H05K 2201/056* (2013.01)

(58) Field of Classification Search
CPC .... G11B 5/486; G11B 5/4846; G11B 33/122; H05K 1/147; H05K 1/189; H05K 2201/056; H05K 1/0281
USPC ................................. 360/264.2, 245.9, 266.3
See application file for complete search history.

(56) References Cited

U.S. PATENT DOCUMENTS

| | | | | |
|---|---|---|---|---|
| 5,276,572 A * | 1/1994 | Kinoshita | ............ | G11B 25/043 360/99.18 |
| 5,375,021 A * | 12/1994 | Boeckner | ............ | G11B 5/4846 360/264.2 |
| 5,422,764 A | 6/1995 | McIlvanie | | |
| 5,760,997 A * | 6/1998 | Koyanagi | ............ | G11B 5/4846 174/254 |
| 5,923,501 A * | 7/1999 | Suzuki | ................ | G11B 5/4806 360/264.2 |
| 6,168,459 B1 * | 1/2001 | Cox | ..................... | G11B 5/4846 360/99.18 |
| 6,388,834 B1 * | 5/2002 | Bernett | .................. | G11B 19/04 360/246 |
| 8,259,417 B1 * | 9/2012 | Ho | ....................... | G11B 5/4833 360/245.9 |
| 2003/0227711 A1 * | 12/2003 | Macpherson | .......... | G11B 5/484 360/97.16 |
| 2004/0156146 A1 * | 8/2004 | Nakano | ................. | G11B 5/486 360/264.2 |
| 2005/0141141 A1 * | 6/2005 | Sekimoto | ............ | G11B 33/122 360/266.3 |
| 2005/0190489 A1 * | 9/2005 | Izumi | .................. | G11B 33/122 360/97.19 |
| 2006/0291094 A1 * | 12/2006 | Ueda | .................... | G11B 25/043 360/97.19 |
| 2008/0285243 A1 * | 11/2008 | Kagawa | ............... | G11B 25/043 361/749 |
| 2009/0097161 A1 * | 4/2009 | Naruse | ................ | G11B 5/4846 360/244.1 |

FOREIGN PATENT DOCUMENTS

| | | | |
|---|---|---|---|
| JP | H03014796 | | 2/1991 |
| JP | H10269720 A | | 10/1998 |
| JP | 2005317081 A | * | 11/2005 |
| JP | 2007095145 A | * | 4/2007 |

* cited by examiner

*Primary Examiner* — Will J Klimowicz
(74) *Attorney, Agent, or Firm* — Patterson & Sheridan, LLP

(57) ABSTRACT

A flexible printed circuit assembly includes a flexible printed circuit board including a base portion and a relay portion extending from a first edge of the base portion and capable of being bent relative to the base portion, a first reinforcing member disposed at the relay portion, and a second reinforcing member attached to a first region of the base portion that includes a second edge opposite to the first edge and having an engaging portion. The first region of the base portion is capable of being folded back towards a second region of the base portion that includes the first edge, and the engaging portion of the second reinforcing member is capable of being engaged with the first reinforcing member.

20 Claims, 10 Drawing Sheets

FLEXIBLE PRINTED CIRCUIT ASSEMBLY AND DISK DRIVE INCLUDING THE SAME

CROSS-REFERENCE TO RELATED APPLICATION

This application is based upon and claims the benefit of priority from U.S. Provisional Patent Application No. 62/087,030, filed Dec. 3, 2014, the entire contents of which are incorporated herein by reference.

FIELD

Embodiments described herein relate generally to a flexible printed circuit (FPC) assembly and a disk device including the FPC assembly.

BACKGROUND

A magnetic disk device typically includes, in a housing, a magnetic disk, a spindle motor which supports and rotates the magnetic disk, a head stack assembly (HSA) which supports a magnetic head, a voice coil motor which moves the HSA, a flexible printed circuit board unit (hereinafter, FPC unit), and the like.

The HSA includes a bearing attached to the housing, and a plurality of arms which are stacked in the bearing and extend from the bearing. The magnetic head is attached to each arm via a suspension. The FPC unit including a base portion and a relay portion (hereinafter, relay FPC) that are integrally formed. On the base portion, for example, an electronic component and a connector are mounted, and the base portion is fixed to the housing. The relay FPC has a band shape which is bent and extends from the base portion to the vicinity of the bearing. The extended end portion of the relay FPC constitutes a connection portion, which is fixed to the bearing of the HSA (for example, by a screw).

The relay FPC is bent with respect to the base portion. When the bent state of the relay FPC is unstable, the relay FPC may influence precise movement of the HSA, as the relay FPC is connected with the HSA.

DETAILED DESCRIPTION

Various embodiments will be described hereinafter with reference to the accompanying drawings.

In general, according to one embodiment, a flexible printed circuit assembly includes a flexible printed circuit board including a base portion and a relay portion extending from a first edge of the base portion and capable of being bent relative to the base portion, a first reinforcing member disposed at the relay portion, and a second reinforcing member attached to a first region of the base portion that includes a second edge opposite to the first edge and having an engaging portion. The first region of the base portion is capable of being folded back towards a second region of the base portion that includes the first edge, and the engaging portion of the second reinforcing member is capable of being engaged with the first reinforcing member.

The following describes a hard disk drive (HDD) according to an embodiment as a disk device in detail with reference to the accompanying drawings.

First Embodiment

Figure 1:
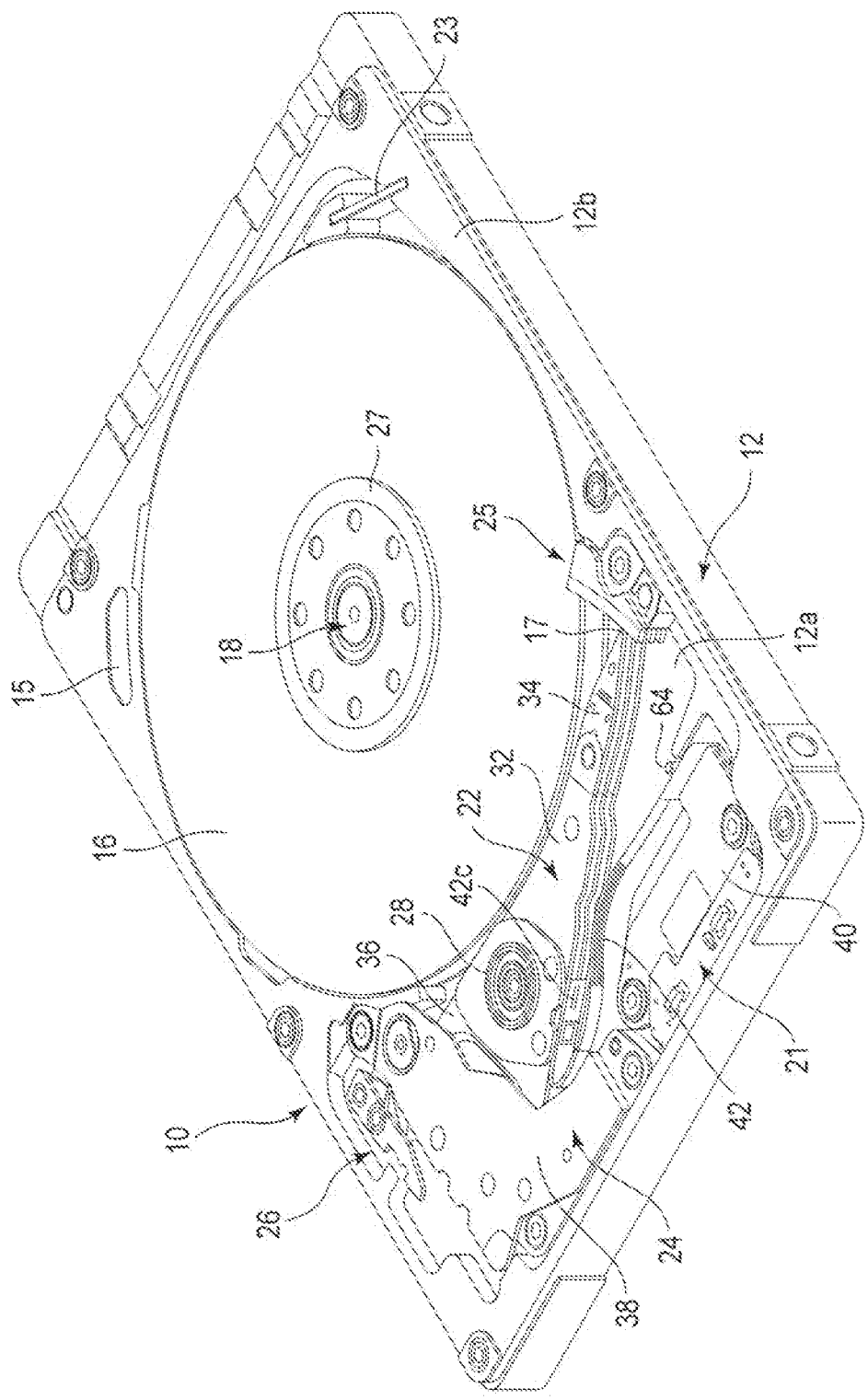
FIG. 1 is a perspective view of a hard disk drive (HDD), from which a top cover is removed, according to a first embodiment.

FIG. 1 shows an internal structure of an HDD from which a top cover is removed. As shown in FIG. 1, the HDD includes a housing 10. The housing 10 includes a base 12 having a shape of a rectangular box of which top side is open, and a top cover (not shown) which is fixed to the base 12 by a plurality of screws and closes the upper end opening of the base 12. The base 12 includes a rectangular bottom wall 12a and sidewalls 12b provided along the peripheral edge of the bottom wall.

In the housing 10, two magnetic disks 16 are provided as storage media, and a spindle motor 18 is provided as a driving portion which supports and rotates the magnetic disks 16. The spindle motor 18 is provided on the bottom wall 12a. The magnetic disks 16 are concentrically fit in a hub (not shown) of the spindle motor 18, are clamped by a clamp spring 27, and are fixed to the hub. Thus, the magnetic disks 16 are supported parallel to the bottom wall 12a of the base 12. The magnetic disks 16 are rotated by the spindle motor 18 at a predetermined speed.

In the housing 10, a plurality of magnetic heads 17 and a head stack assembly (hereinafter, referred to as an HSA) 22 are provided. The magnetic heads 17 record (write) data to and reproduce (read) data in the magnetic disks 16. The HSA 22 moves the magnetic heads 17 relative to the magnetic disks 16. Moreover, in the housing 10, a voice coil motor (hereinafter, VCM) 24, a ramp load mechanism 25, a latch mechanism 26, and an FPC assembly 21 are provided. The VCM 24 rotates the HSA 22 and determines the position of the HSA 22. The ramp load mechanism 25 supports the magnetic heads 17 in an unload position apart from the magnetic disks 16 when the magnetic heads 17 move to outside of the outermost circumference of the magnetic disks 16. The latch mechanism 26 supports the HSA in an escape position when an impact has been made on the HDD. The FPC assembly 21 includes a conversion connector, etc.

A printed circuit board (not shown) is fixed to the external surface of the bottom wall 12a of the base 12 by a screw. The printed circuit board controls the operations of the spindle motor 18, the VCM 24, and the magnetic heads 17, via the FPC assembly 21. A circulation filter 23 is provided in the sidewall 12b of the base 12 and positioned outside the magnetic disks 16. The circulation filter 23 captures dust generated within the housing 10 as movable portions in the housing 10 move. A respiration filter 15 is further provided in the sidewall 12b of the base 12 and captures dust from the air flowing into the housing 10. The respiration filter 15 may be attached to the inner surface of the top cover.

For example, each magnetic disk 16 includes a base plate, which is formed of a nonmagnetic material and which has a discoid shape having a diameter of approximately 2.5 inches (6.35 cm). On both surfaces of the base plate, a soft magnetic layer formed of a material having a soft magnetic property is stacked as a foundation layer. On the soft magnetic layer, a magnetic recording layer is stacked. On the magnetic recording layer, a protective film layer is stacked.

As shown in FIG. 1, the HSA 22 includes a rotatable bearing 28, four arms 32, which are attached to the bearing 28 in a stacked state, and a suspension 34 which extends from each arm 32. Each arm 32 is formed in a long flat plate shaper and formed of a stainless material or aluminum. The magnetic heads 17 are supported in the distal end portion of the suspension 34.

A wiring member (flexure; not shown) is fixed onto each arm 32 and the suspension 34. An end of the wiring member is connected to the magnetic heads 17, and the other end is connected to a relay FPC 42 of the FPC assembly 21. In this manner, each magnetic head 17 supported on the suspension 34 is electrically connected to the FPC assembly 21 via the wiring member and the relay FPC 42.

The HSA 22 includes a support frame 36 which extends from the bearing 28 in a direction opposite to the arms 32. By the support frame, a voice coil, which constitutes a part of the VCM 24, is supported. The voice coil is positioned between a pair of yokes 38 fixed onto the bottom wall 12a of the base 12. The voice coil, the yokes, and a magnet (not shown) fixed to one of the yokes constitute the VCM 24.

When power is supplied to the voice coil, the HSA 22 rotates around the bearing 28, and each magnetic head 17 moves to a desired track of the magnetic disks 16. In this manner, the position of each magnetic head 17 is determined in the desired track.

The following describes the FPC assembly 21 in detail.

Figure 2:
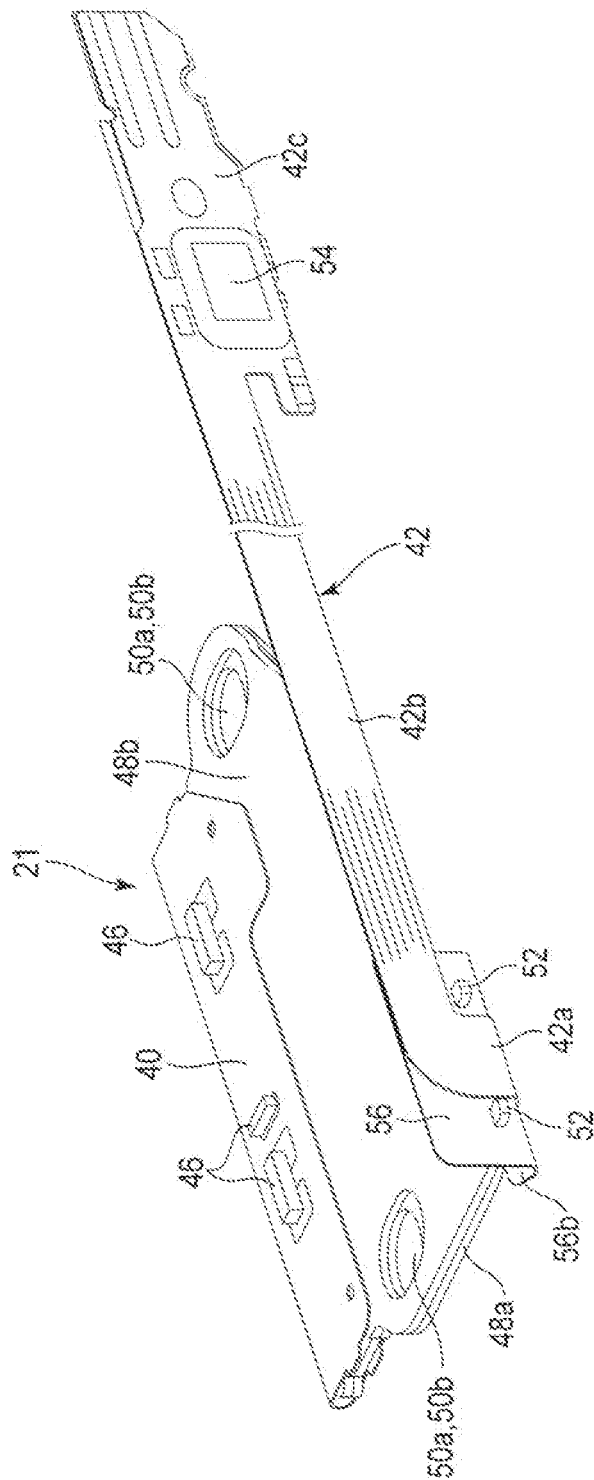
FIG. 2 is a perspective view of an FPC assembly of the HDD.
Figure 3:
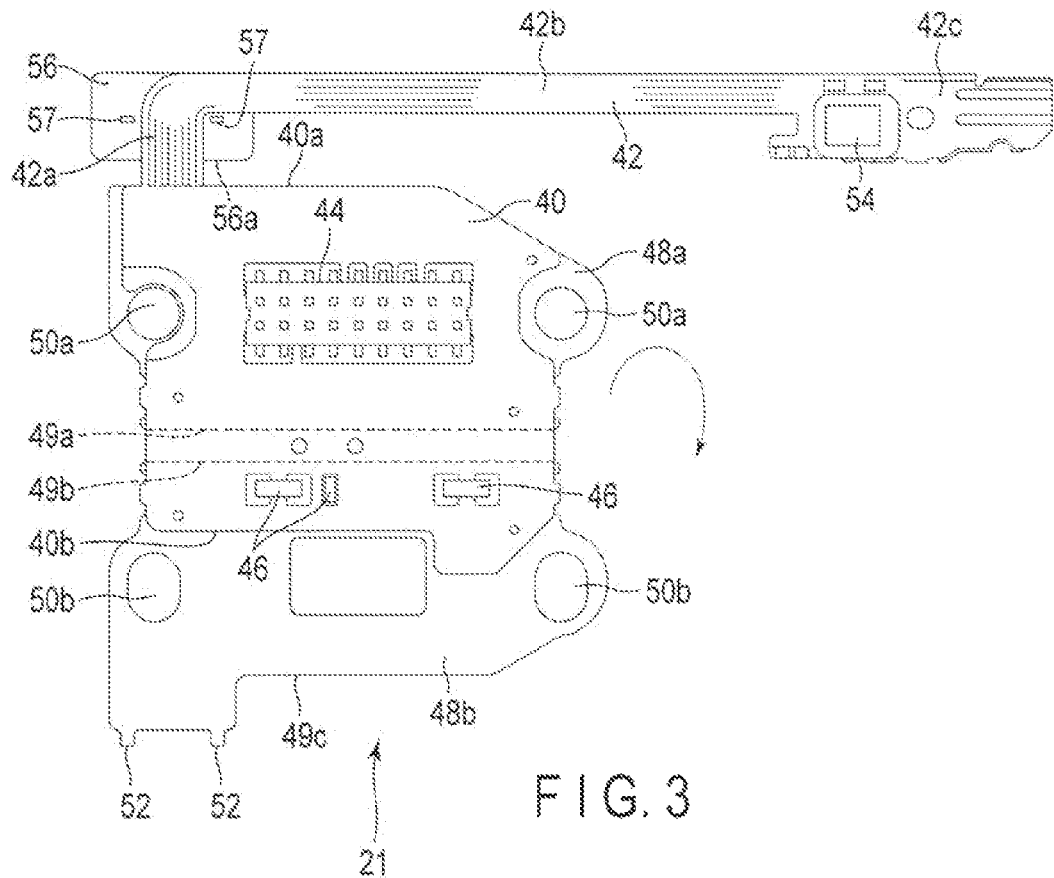
FIG. 3 is a development view of the FPC assembly.
Figure 4:
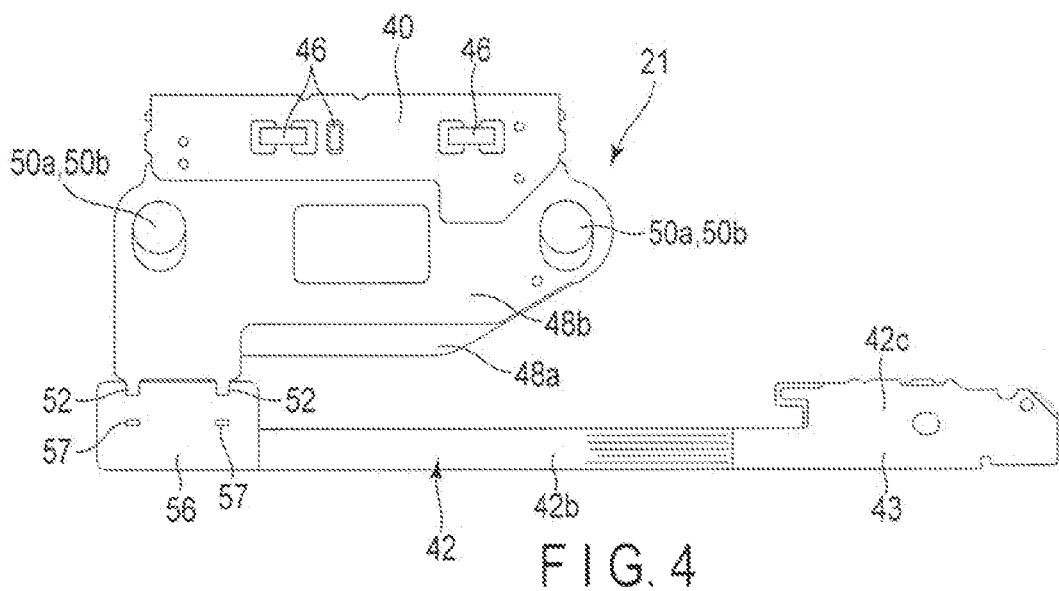
FIG. 4 is a plan view of the FPC assembly in a state where a base portion of the FPC assembly is folded.
Figure 5:
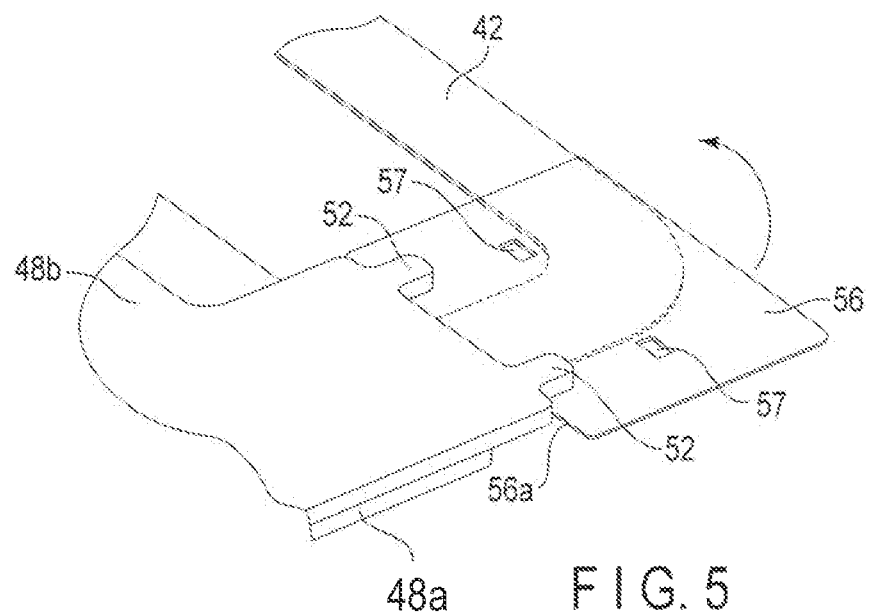
FIG. 5 is a perspective view of engagement projections and a reinforcing sheet of the FPC assembly.
Figure 6:
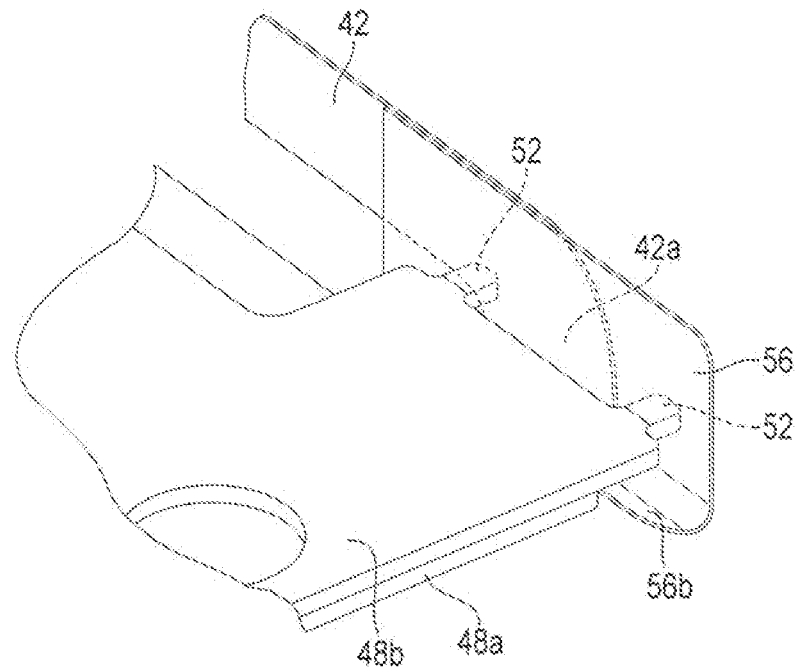
FIG. 6 is a perspective view of a base end portion of a relay FPC and the reinforcing sheet which are bent and fit with the engagement projections.

FIG. 2 is a perspective view of the FPC assembly 21. FIG. 3 is a development view of the FPC assembly 21. FIG. 4 is a plan view of the FPC assembly 21 in a state where a base portion of the FPC assembly is folded. FIG. 5 is a perspective view of engagement projections and a reinforcing sheet of the FPC assembly 21. FIG. 6 is a perspective view of a base end portion of the relay FPC 42 and the reinforcing sheet, which are bent and fit with the engagement projections.

As shown in FIG. 2 to FIG. 4, the FPC assembly 21 integrally includes a base portion 40, which is substantially rectangular, and the relay FPC 42, which has a shape of a long band extending from a lateral edge (a first lateral edge 40a) of the base portion 40. The base portion 40 and the relay FPC 42 are formed of a flexible printed circuit board. The flexible printed circuit board includes an insulating layer formed of polyimide, etc., a conductive layer formed on the insulating layer, which forms an interconnection, a connection pad, etc., and a protective layer covering the conductive layer.

As shown in FIG. 3, electronic components such as a conversion connector 44 and a plurality of capacitors 46 are mounted on one side (the outer surface) of the base portion 40, and are electrically connected to an interconnection (not shown). Two metal plates, which function as reinforcing plates, are attached to the other side (the inner surface) of the base portion 40. The two metal plates are a first metal plate 48a and a second metal plate 48b. The first and second metal plates 48a and 48b are formed of aluminum, etc.

The first metal plate 48a has a dimension which is slightly smaller than the base portion 40. Almost the whole surface of the first metal plate 48a is attached to the base portion 40. The first metal plate 48a includes lateral edges overlapping, of the base portion 40, the first lateral edge 40a from which the relay FPC 42 extends, and two lateral edges which are continuous with the first lateral edge 40a and face each other, respectively. A second lateral edge 49a of the first metal plate 48a is positioned apart from a second lateral edge 40b of the base portion 40 and inside the base portion 40. The conversion connector 44 is mounted in a position corresponding to the first metal plate 48a. The first metal plate 48a includes two through-holes 50a. A screw is inserted into each of the through-holes 50a. Through-holes 50a are positioned longitudinally on both sides of the conversion connector 44.

The second metal plate 48b has a shape and a dimension which are substantially the same as those of the first metal plate 48a. A part of the second metal plate 48b is attached to the base portion 40. A lateral edge 49b of the second metal plate 48b faces the lateral edge 49a of the first metal plate 48a in parallel thereto across a space. Approximately two-thirds of the second metal plate 48b extends outward beyond the second lateral edge 40b of the base portion 40. The capacitors 46 are mounted in positions corresponding to the second metal plate 48b. The second metal plate 48b includes two through-holes 50b. A screw is inserted into each of the through-holes 50b. Through-holes 50b are provided in positions which do not overlap the base portion 40 and correspond to through-holes 50a of the first metal plate 48a. The second metal plate 48b integrally includes a plurality of, for example, two engagement projections 52 which project from a lateral edge 49c opposite to the first metal plate 48a. The engagement projections 52 project at right angles to the lateral edge 49c of the second metal plate 48b, and project parallel to the top surface of the second metal plate 48b and the top surface of the base portion 40. The two engagement projections 52 are provided at an interval larger than the width of the relay FPC 42.

As shown in FIG. 3, the relay FPC 42 integrally includes a base end portion 42a, an extended portion 42b, and a connection end portion 42c. The base end portion 42a extends from the first lateral edge 40a of the base portion 40 substantially at right angles to the first lateral edge 40a, and the extended portion 42b is bent from the base end portion 42a substantially at right angles and extends substantially parallel to the first lateral border 40a of the base portion 40. The connection end portion 42c is an extended end portion of the extended portion 42b. The relay FPC 42 includes a plurality of interconnections which extend from the base portion 40 to the connection end portion 42c. A head amplifier IC 54 and other electronic components are mounted on a top surface of the connection end portion 42c, and are electrically connected to the interconnections. A plurality of connection pads for connection to the wiring member of the HSA 22 are provided in the connection end portion 42c. As a reinforcing plate, for example, a backing plate 43 (FIG. 4) formed of aluminum is attached to the inner surface (back side) of the connection end portion 42c.

As shown in FIG. 3, a reinforcing sheet 56 is attached to the base end portion 42a of the relay FPC 42. For example, the reinforcing sheet 56 is formed in a rectangular shape and of synthetic resin such as polyimide, and extends widthways to both sides of the base end portion 42a. The reinforcing sheet 56 is preferably formed of a material which is more rigid than the relay FPC 42. The reinforcing sheet 56 is provided on the inner surface of the base end portion 42a. In other words, the reinforcing sheet 56 is provided on the same side as the inner surface of the base portion 40. The reinforcing sheet 56 includes two engagement holes 57. The two engagement holes 57 are positioned widthways on both sides of the base end portion 42a. The reinforcing sheet 56 includes a lateral edge 56a which faces the first lateral edge 40a of the base portion 40 substantially parallel thereto across a space. The reinforcing sheet 56 is not limited to an independent sheet. The reinforcing sheet 56 may be the same insulating layer as the insulating layer of the flexible printed circuit board.

As shown in FIG. 2 and FIG. 4, the base portion 40 is folded at 180 degrees along a portion between the first metal plate 48a and the second metal plate 48b in such a way that the first and second metal plates 48a and 48b overlap and face each other. Through-holes 50a and 50b of the first and second metal plates 48a and 48b are aligned with each other. The engagement projections 52 of the second metal plate 48b project beyond the first lateral edge 40a of the base portion 40 towards the relay FPC 42.

As shown in FIG. 2, FIG. 5, and FIG. 6, the base end portion 42a of the relay FPC 42 is bent substantially at right angles to the base portion 40 together with the reinforcing sheet 56 along a line extending between the lateral edge 56a and the engagement holes 57 of the reinforcing sheet 56. The engagement projections 52 of the second metal plate 48b are inserted into and fit in the engagement holes 57 of the reinforcing sheet 56. In this manner, the engagement projections 52 determine the positions of the base end portion 42a and the reinforcing sheet 56 and maintain the base end portion 42a and the reinforcing sheet 56 in a position where the base end portion 42a and the reinforcing sheet 56 stand at right angles. As a result, the top surface and the inner surface of the relay FPC 42 are substantially perpendicular to the base portion 40.

The end portion of the bent reinforcing sheet 56 including the lateral edge 56a constitutes a bent portion 56b which faces the inner surface of the second metal plate 48b across a space. The bent portion 56b applies, to the other portion of the reinforcing sheet 56, tension or an elastic force in a direction retreating from the base portion 40, that is, in a direction inclining on a side opposite to the base portion 40 around an engagement position with the engagement projections 52.

Figure 7:
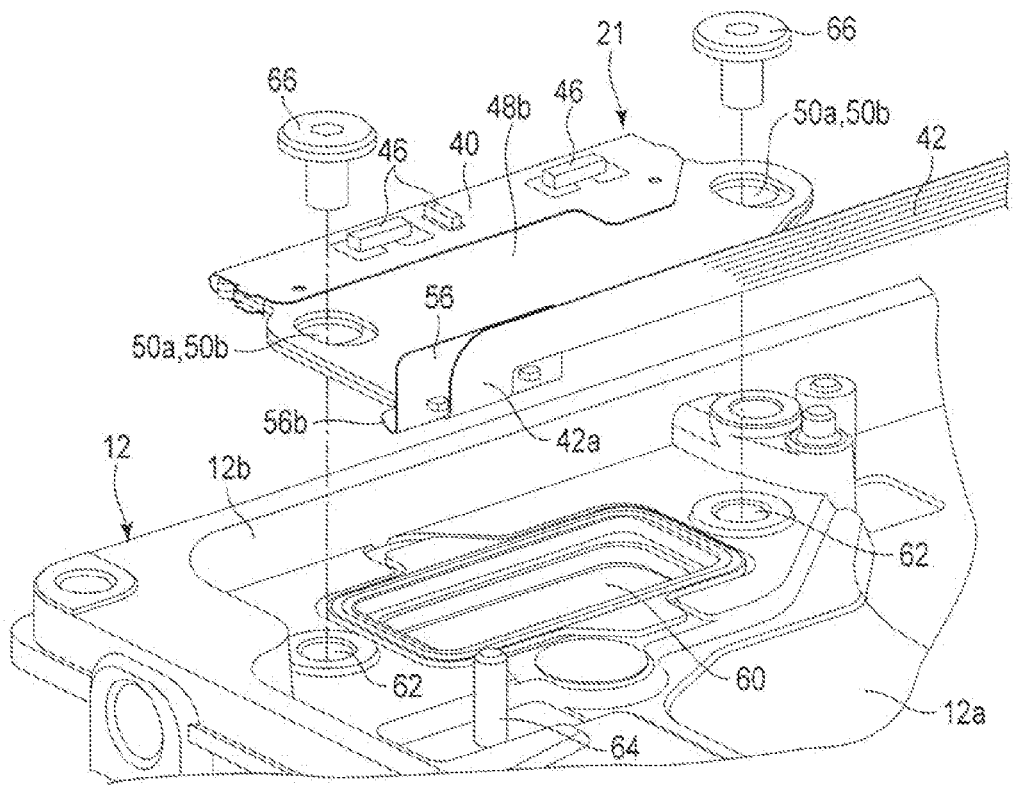
FIG. 7 is an exploded perspective view of the FPC assembly and a housing of the HDD.
Figure 8:
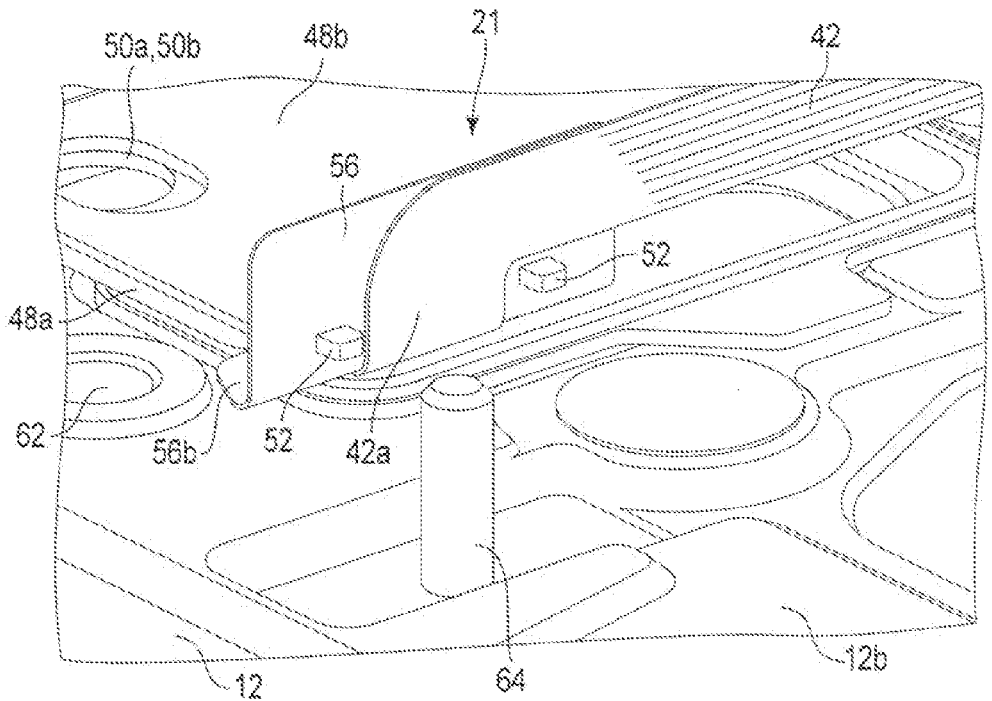
FIG. 8 is an exploded perspective view of a bent portion of the FPC assembly and a support post of the housing.
Figure 9:
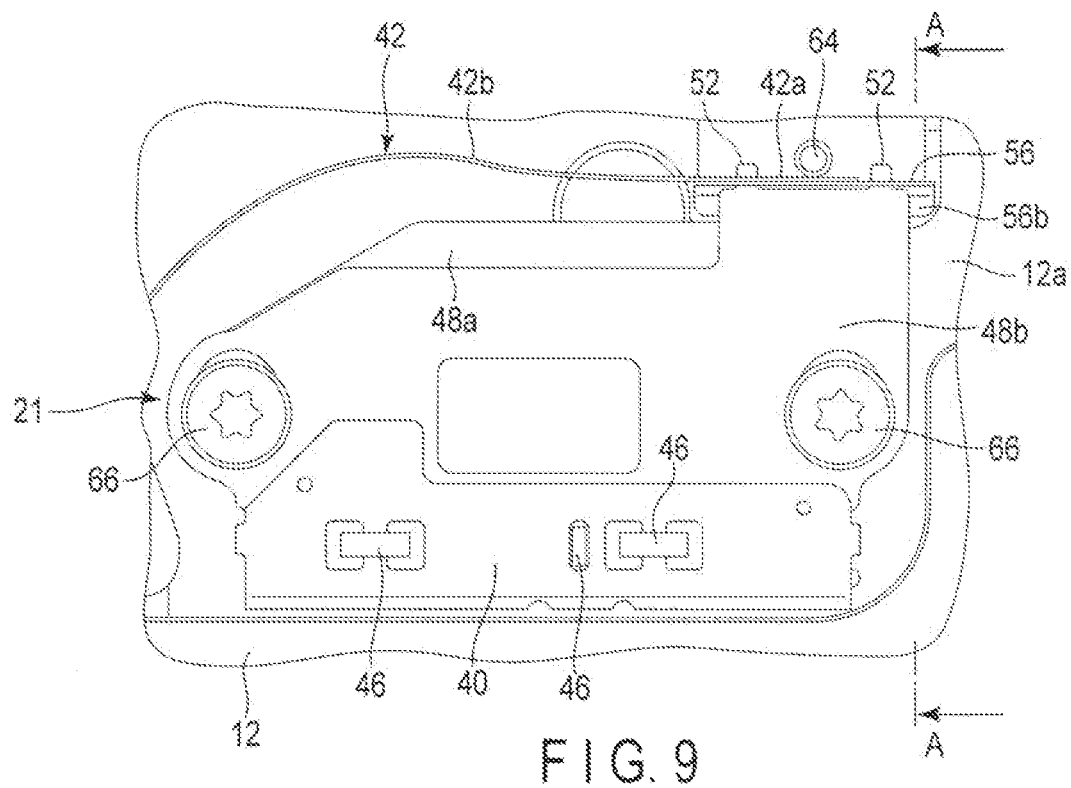
FIG. 9 is a plan view of the FPC assembly disposed on a bottom wall of the housing.
Figure 10:
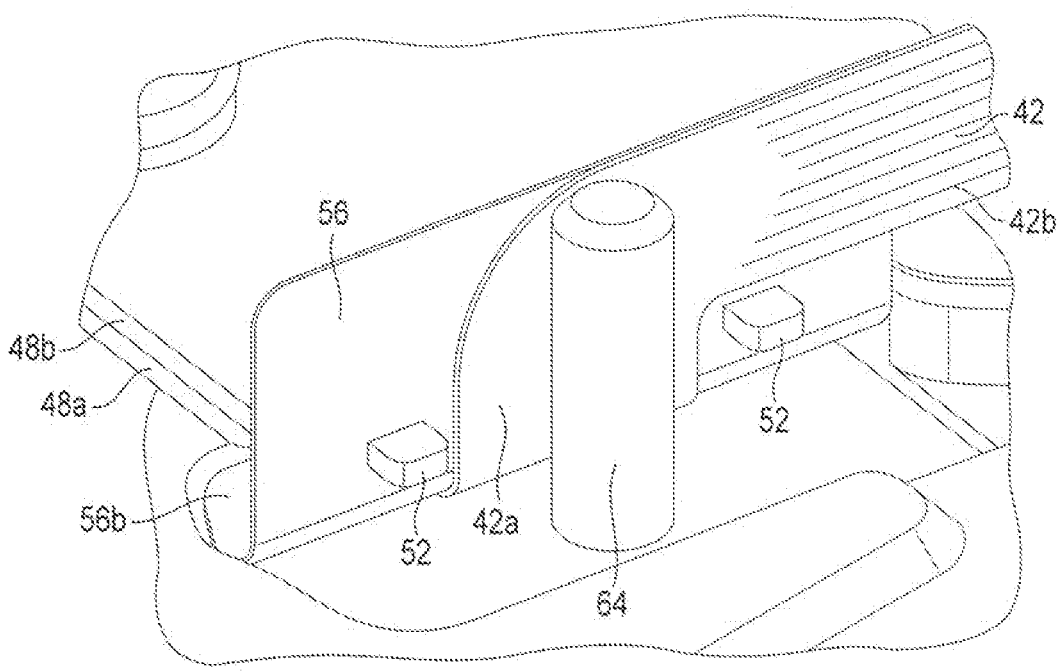
FIG. 10 illustrates layout relationship between the bent portion of the FPC assembly and the support post.
Figure 11:
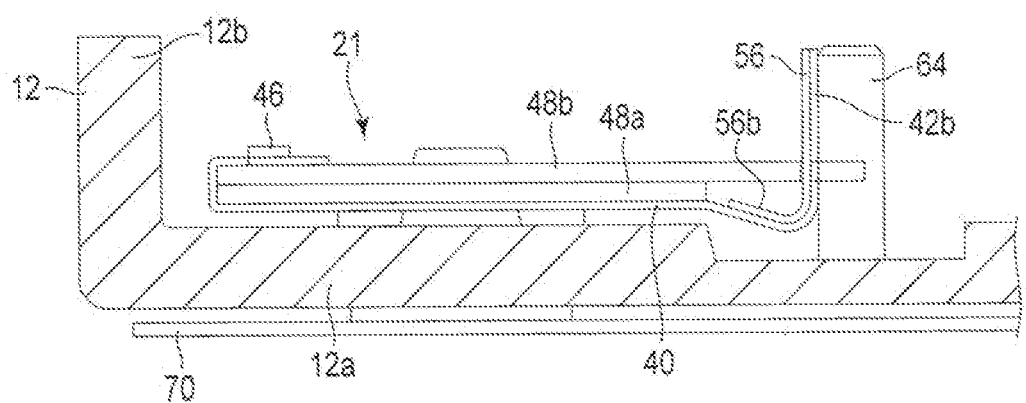
FIG. 11 is a cross-sectional view of the housing and the FPC assembly along line A-A of FIG. 9.

FIG. 7 is an exploded perspective view of the FPC assembly 21 and the base 12 of the HDD. FIG. 8 is an exploded perspective view of the bent portion of the FPC assembly 21 and a support post of the base 12. FIG. 9 is a plan view of the FPC assembly 21 disposed on the bottom wall 12a of the base 12. FIG. 10 illustrates layout relationship between the bent portion of the FPC assembly 21 and the support post. FIG. 11 is a cross-sectional view of the base 12 and the FPC assembly 21 along line A-A of FIG. 9.

As shown in FIG. 7 and FIG. 8, the FPC assembly 21 is fixed onto the bottom wall 12a of the base 12. An aperture 60 and screw holes 62 are formed in the bottom wall 12a of the base 12. The conversion connector 44 (FIG. 3) is inserted into the aperture 60. The screw holes 62 are positioned on both sides of the aperture 60. A support post 64, which functions as a supporting portion, is provided near the aperture 60 in the bottom wall 12a. The support post 64 has, for example, a cylindrical shape, and is substantially perpendicular to the bottom wall 12a. The support post 64 may be integrally formed with the base 12 and of the same material as the base 12 or may be fixed to the base 12 as a separate unit.

As shown in FIG. 7 to FIG. 11, the base portion 40 of the FPC assembly 21 is located on the bottom wall 12a and fixed to the bottom wall 12a with two fixing screws 66 in a state where the conversion connector 44 is inserted into the aperture 60. Each fixing screw 66 is screwed in the respective screw holes 62 of the bottom wall 12a via through-holes 50a and 50b of the first and second metal plates 48a and 48b. The conversion connector 44 is connected to a control circuit 70 (FIG. 11) facing the external surface of the bottom wall 12a.

The base end portion 42a of the relay FPC 42 is into contact with the support post 64, and is supported in such a way that the base end portion 42a is substantially perpendicular to the bottom wall 12a. The base end portion 42a of the relay FPC 42 is positioned between the support post 64 and the base portion 40, and is into contact with the support post 64. The support post 64 prevents the base end portion 42a from inclining. At this time, the reinforcing sheet 56 including the bent portion 56b applies, to the base end portion 42a, tension or an elastic force in a direction retreating from the base portion 40. Therefore, the base end portion 42a is pressed against the support post 64, and is maintained in a state where the base end portion 42a perpendicularly stands along the support post 64. At the same time, the above-described tension or elastic force prevents the base end portion 42a from inclining towards the base portion 40. Thus, the relay FPC 42 extends in the housing 10 in a state where the top surface and the inner surface of the relay FPC 42 are substantially perpendicular to the bottom wall 12a.

As shown in FIG. 1, the connection end portion 42c of the relay FPC 42 is fixed to the vicinity of the bearing 28 of the HSA 22. The connection end portion 42c is electrically and mechanically connected to the wiring member of the HSA 22 and the voice coil. Each magnetic head 17 of the HSA 22 and the voice coil are electrically connected to the base portion 40 via the wiring member or the relay FPC 42. Further, the base portion 40 is electrically connected to the control circuit 70 via the conversion connector 44. In this manner, the FPC assembly 21 sends, for example, a driving signal and a recording signal output from the control circuit 70 to the magnetic heads 17 and the voice coil, and sends a read signal read by the magnetic heads 17 to the control circuit 70 after the read signal is amplified by the head amplifier IC 54.

In the FPC assembly of the above structures and the HDD including such an FPC assembly, it is possible to maintain the relay FPC in a state where the relay FPC is bent at right angles and determine the position of the relay FPC perpendicularly or heightwise by fitting the engagement projections of the reinforcing plate in the reinforcing sheet. Moreover, it is possible to prevent the angle of the bent portion from being changed due to a handling mistake during the assembly process. In the present embodiment, tension or an elastic force is applied to the reinforcing sheet in a direction retreating from the base portion. By the reinforcing sheet, the base end portion of the relay FPC is pressed against the support post. Thus, it is possible to prevent the relay FPC from inclining, and further firmly maintain the bent state at right angles. The relay FPC can be maintained perpendicularly to the bottom wall of the housing. Twist of the relay FPC or contact with adjacent members can be prevented.

According to the present embodiment, it is possible to obtain an FPC assembly and an HDD which do not impair the seek operation of the HSA, as the relay FPC smoothly deforms in accordance with the seek operation of the HSA.

The following describes an FPC assembly according to another embodiment. In the embodiment described below, the same structures as the first embodiment are depicted with the same reference numbers. The detailed explanation of such structures is omitted.

Second Embodiment

Figure 12:
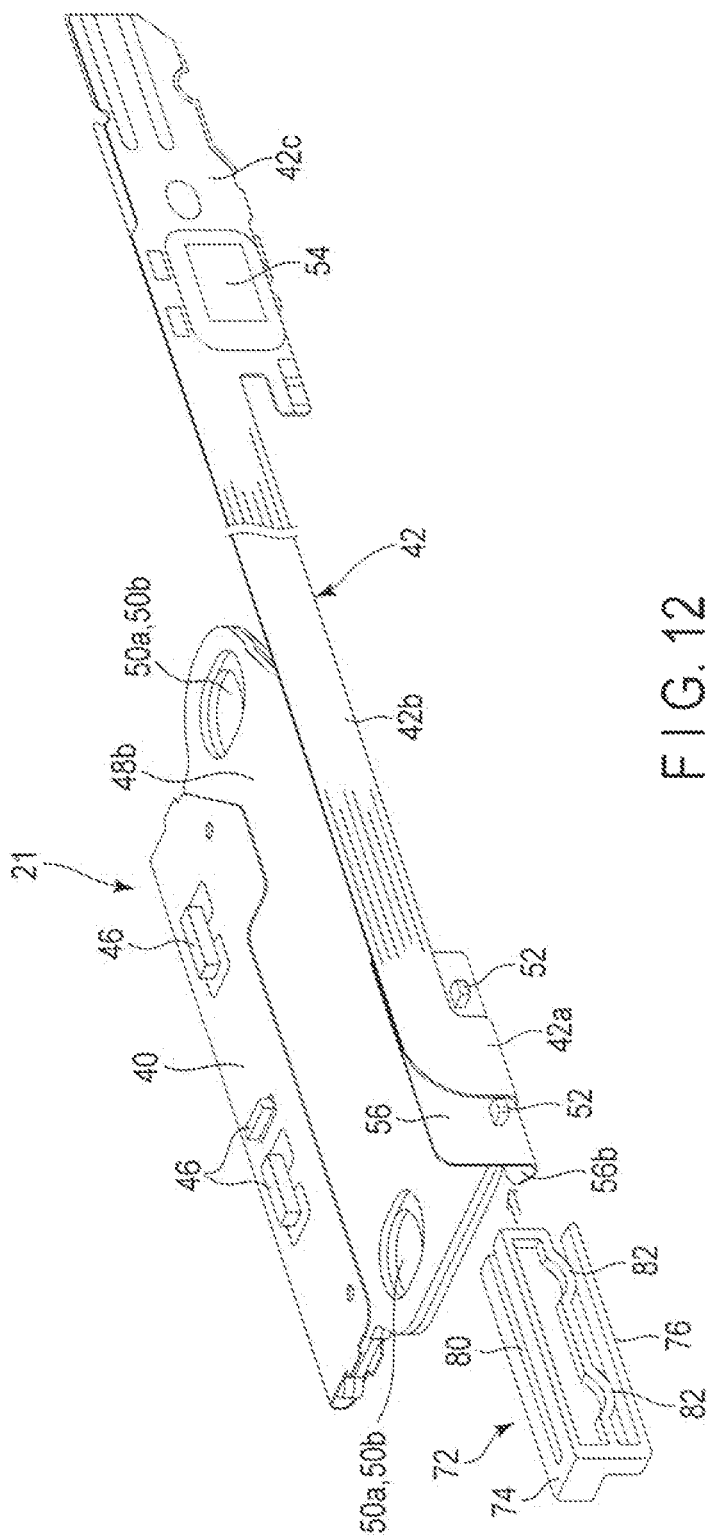
FIG. 12 is a perspective view of an FPC assembly according to a second embodiment.
Figure 13:
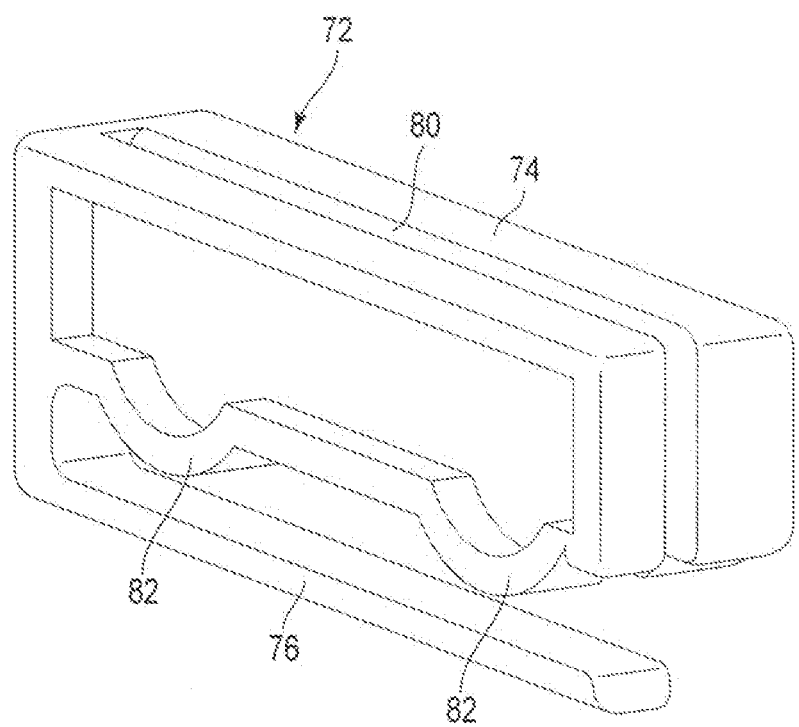
FIG. 13 is a perspective view of a clip used with the FPC assembly of the second embodiment.
Figure 14:
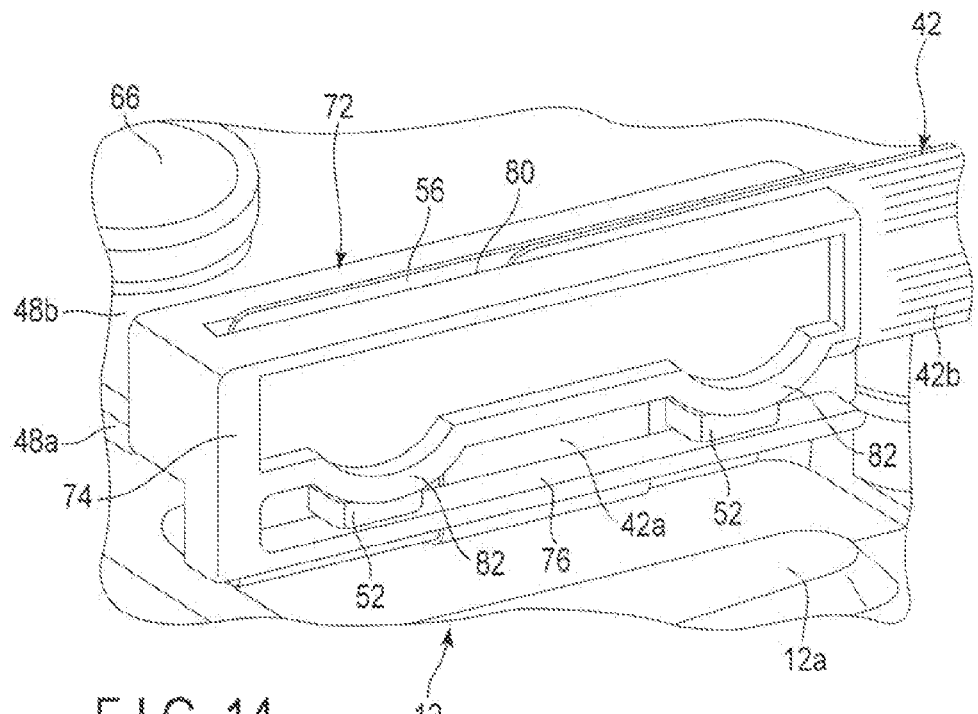
FIG. 14 is a perspective view of the clip attached to a bent portion of the FPC assembly.
Figure 15:
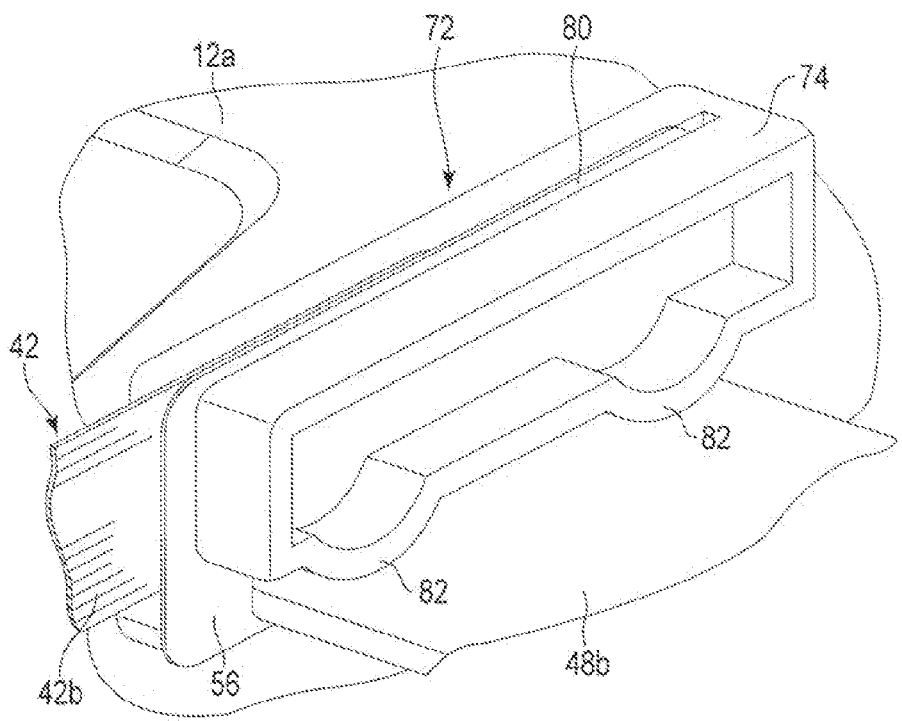
FIG. 15 is a perspective view of the clip attached to the bent portion of the FPC assembly, from a direction different from that of FIG. 14.

FIG. 12 is a perspective view of an FPC assembly according to a second embodiment. FIG. 13 is a perspective view of a clip used with the FPC assembly of the second embodiment. FIG. 14 is a perspective view of a part of the FPC assembly to which the clip is attached. FIG. 15 is a perspective view of a part of the FPC assembly to which the clip is attached from a different direction.

In the second embodiment, a clip is employed as a fixing member, instead of the support post used in the first embodiment. As shown in FIG. 12, an FPC assembly 21 is structured in the same manner as the FPC assembly according to the first embodiment, and further includes a clip 72.

As shown in FIG. 12 and FIG. 13, the clip 72 includes a main body 74 which substantially has the shape of a rectangular parallelepiped, and a clamp arm 76 which extends from the main body 74 and is capable of elastically deforming. The clip 72 is integrally formed with the main body 74 and the clamp arm 76, and formed of synthetic resin, etc. The main body 74 includes a slit 80, which is formed in the central portion, and a pair of arcuate projecting portions (contact portions) 82 which project from the lower surface. The slit 80 extends longitudinally along the main body 74, and opens on the upper surface of the main body 74, the lower surface of the main body 74 and a side end surface of the main body 74. The slit 80 is defined by two inner surfaces of the main body 74 which face each other across a space.

The shape of the main body 74 is not limited to the shape of the rectangular parallelepiped. For example, the main body 74 may be formed in the shape of a rectangular frame having a hollow portion in the central portion.

The clamp arm 76 is formed in a bar shape. The clamp arm 76 extends longitudinally along the main body 74, and faces the two projecting portions 82 of the main body 74 across a space. One of the longitudinal end portions (base end portion) of the clamp arm 76 is connected to the main body 74. The other longitudinal end portion (free end portion) of the clamp arm 76 extends to the vicinity of an end surface of the main body 74 in which the slit 80 opens, and faces the lower surface of the main body 74 across a space. The position of the clamp arm 76 can be changed in a direction approaching or retreating from the projecting portions 82 by elastic deformation of the base end portion.

As shown in FIG. 14 and FIG. 15, the clip 72 is attached to a base end portion 42a of a relay FPC 42. A portion of the base end portion 42a of the relay FPC 42 located above engagement projections 52, and a portion of a reinforcing sheet 56 located above the engagement projections 52 are inserted into the slit 80 of the clip 72. The projecting portions 82 are brought into contact with the upper surface of a second metal plate 48b and the upper surfaces of the two engagement projections 52. At the same time, the two engagement projections 52 are inserted and clamped between the projecting portions 82 and the clamp arm 76. As the clip 72 is attached in this manner, the base end portion 42a of the relay FPC 42 is maintained in a state where the base end portion 42a stands at right angles to a base portion 40.

As explained above, in the FPC assembly which employs the clip 72 as a fixing member, it is possible to prevent the relay FPC 42 from inclining, and maintain the bent portion of the relay FPC at right angles to the base portion. In this manner, it is possible to maintain the relay FPC in a state where the relay FPC is perpendicular to the bottom wall of the housing, and prevent the relay FPC from twisting or being in contact with adjacent members. Moreover, there is no need to provide a retaining member (support post) on the housing of the HDD. The existing housing can be used without design change. An effect similar to the first embodiment can be obtained in the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the FPC assembly, the number of the engagement projections of the reinforcing plate is not limited to two, and may be three or more. The shape or material of each structural element is not limited to the above embodiments, and can be appropriately changed.

What is claimed is:

1. A flexible printed circuit assembly, comprising:
a flexible printed circuit board including a base portion and a relay portion extending from a first edge of the base portion and capable of being bent relative to the base portion;
a first reinforcing member disposed at the relay portion; and
a second reinforcing member attached to a first region of the base portion that includes a second edge opposite to the first edge and having an engaging portion, wherein
the first region of the base portion is capable of being folded back towards a second region of the base portion that includes the first edge, and the engaging portion of the second reinforcing member is capable of being engaged with the first reinforcing member.

2. The flexible printed circuit assembly according to claim 1, wherein
the engaging portion includes a protrusion protruding from an edge of the second reinforcing member, and capable of being engaged with the first reinforcing member by being fit in a hole formed in the first reinforcing member.

3. The flexible printed circuit assembly according to claim 1, wherein
the first reinforcing member is attached to the relay portion.

4. The flexible printed circuit assembly according to claim 3, wherein
the first reinforcing member is made of a material that is more rigid than a portion of the relay portion to which the first reinforcing member is capable of being attached.

5. The flexible printed circuit assembly according to claim 1, wherein
the first reinforcing member and the relay portion are integrally formed.

6. The flexible printed circuit assembly according to claim 1, further comprising:
a third reinforcing member attached to the second region of the base portion.

7. The flexible printed circuit assembly according to claim 6, wherein
the second reinforcing member and the third reinforcing member are separated from each other, and the base portion is capable of being folded along a line in a space of the base portion with which the second and third reinforcing member are separated.

8. A disk device, comprising:
a recording medium;
a head configured to write data to and read data from the recording medium; and
a flexible printed circuit assembly electrically connected to the head, the flexible printed circuit assembly including:
   a flexible printed circuit board including a base portion and a relay portion extending from a first edge of the base portion and bent relative to the base portion;
   a first reinforcing member disposed at the relay portion; and
   a second reinforcing member attached to a first region of the base portion that includes a second edge opposite to the first edge and having an engaging portion, wherein
   the first region of the base portion is folded back towards a second region of the base portion that includes the first edge, and the engaging portion of the second reinforcing member is engaged with the first reinforcing member.

9. The disk device according to claim 8, wherein
the engaging portion includes a protrusion protruding from an edge of the second reinforcing member, and engaged with the first reinforcing member by being fit in a hole formed in the first reinforcing member.

10. The disk device according to claim 8, further comprising:
a fixing member fixing an angle between the base portion and the relay portion.

11. The disk device according to claim 10, wherein
the fixing member includes a clip attached to the engaging portion.

12. The disk device according to claim 11, wherein
the clip includes a main body having a slit in which the relay portion and the first reinforcing member are located, and an arm extending from the main body, and
the engaging portion is clipped between the main body and the arm.

13. The disk device according to claim 12, wherein
the main body includes a protrusion protruding towards the arm, and
the engaging portion is clipped between the protrusion of the main body and the arm.

14. The disk device according to claim 10, further comprising:
a housing in which the recording medium, the head, and the flexible printed circuit assembly are housed, wherein
the housing includes a supporting portion which prevents the relay portion from being inclined.

15. The disk device according to claim 14, wherein
the supporting portion extends from a bottom surface of the housing and is in contact with the relay portion.

16. The disk device according to claim 15, wherein
the supporting portion is in contact with the bent portion of the relay portion.

17. The disk device according to claim 8, wherein
the first reinforcing member is attached to the relay portion.

18. The disk device according to claim 17, wherein
the first reinforcing member is made of a material that is more rigid than a portion of the relay portion to which the first reinforcing member is capable of being attached.

19. The disk device according to claim 8, wherein
the first reinforcing member and the relay portion are integrally formed.

20. The disk device according to claim 8, wherein
the first reinforcing member is bent along with the relay portion.

* * * * *